United States Patent [19]

Hageraats

[11] Patent Number: 5,614,873
[45] Date of Patent: Mar. 25, 1997

[54] ELECTRONIC CIRCUIT

[75] Inventor: Johannes J. E. M. Hageraats, Eindhoven, Netherlands

[73] Assignee: U.S. Philips Corporation, New York, N.Y.

[21] Appl. No.: 563,723

[22] Filed: Nov. 28, 1995

[30] Foreign Application Priority Data

Dec. 8, 1994 [EP] European Pat. Off. ............. 94203563

[51] Int. Cl.$^6$ .................................................. H03H 11/28
[52] U.S. Cl. .......................................... 333/22 R; 326/30
[58] Field of Search ........................... 333/22 R; 326/30; 327/578

[56] References Cited

U.S. PATENT DOCUMENTS

| | | | |
|---|---|---|---|
| 4,071,778 | 1/1978 | Nakagomi | 327/578 |
| 5,227,677 | 7/1993 | Furman | 326/30 X |
| 5,287,022 | 2/1994 | Wilsher | 333/22 R X |
| 5,523,704 | 6/1996 | So | 333/22 R X |

FOREIGN PATENT DOCUMENTS

| | | |
|---|---|---|
| 3034034A1 | 3/1982 | Germany. |
| 3726362A1 | 2/1989 | Germany. |
| 60-102011 | 6/1985 | Japan. |
| 156723 | 6/1990 | Japan ................. 326/30 |
| 86021 | 3/1992 | Japan ................. 326/30 |

OTHER PUBLICATIONS

"Influence of Transmission-Line Interconnections Between Gigabit-per-Second IC's on Time Jitter and Instabilities", by J. Hauerschild et al, Journal of Solid State Circuits, vol. 25, No. 3, Jun. 1990, pp. 763–766.

*Primary Examiner*—Paul Gensler
*Attorney, Agent, or Firm*—Michael E. Schmitt

[57] ABSTRACT

In order to avoid signal reflections, a transmission line connected to an electronic circuit is terminated by a terminating impedance. The value of the terminating impedance is to match in the best possible way in the frequency zone of the circuit with the value of a characteristic impedance of the transmission line to be terminated. The invention provides an electronic circuit in which the terminating impedance is a series combination of an active impedance and a passive impedance. The passive impedance is of the same order of magnitude as the characteristic impedance. The terminating impedance matches well with the characteristic impedance of the transmission line even at high frequencies. By modifying the settings of the active impedance, both the value of the terminating impedance and the DC voltage on a transmission line termination can be set.

12 Claims, 5 Drawing Sheets

5,614,873

ELECTRONIC CIRCUIT

BACKGROUND OF THE INVENTION

The invention relates to an electronic circuit comprising a terminating impedance for terminating a transmission line connectable to the circuit, in which in a frequency range of the circuit the terminating impedance is matched with a characteristic impedance of the transmission line. The matching of the terminating impedance with the characteristic impedance is necessary to avoid signal reflections on the transmission line. The electronic circuit is preferably realised in the form of an integrated circuit.

An electronic circuit as defined in the opening paragraph is known from Japanese Patent Application 60-102011. In the circuit shown in that document the terminating impedance consists of an active impedance. The active impedance is formed by the output impedance of a common collector stage. The circuit shown does not properly function for high frequencies, because then the output impedance of the common collector stage and thus the terminating impedance is not accurately determined as a result of parasitic influences. Consequently, the terminating impedance is no longer well-matched with the characteristic impedance and strong signal reflections occur.

SUMMARY OF THE INVENTION

It is an object of the invention to realise an electronic circuit as defined in the opening paragraph, which causes less strong signal reflections than the known circuit when a transmission line is connected to the circuit at high frequencies.

The electronic circuit according to the opening paragraph is thereto characterized, in that the terminating impedance is a series combination of an active impedance and a passive impedance while the passive impedance is of the same order of magnitude as the characteristic impedance. This means that the terminating impedance is mainly formed by the passive impedance and to a smaller extent by the active impedance. At high frequencies it is especially the active impedance that is not accurately determined as a result of capacitances present, whereas the passive impedance retains a fairly constant value especially so if the latter consists of a single on-chip resistor. As a result, the terminating impedance in the electronic circuit according to the invention is better matched with the characteristic impedance of the transmission line at high frequencies than in the electronic circuit discussed in cited Japanese Patent Application. Therefore, the signal reflections occurring when the circuit according to the invention is used at high frequencies is less strong than when the prior-art circuit is used.

An electronic circuit in which the terminating impedance as a whole is brined by a passive impedance which consists of a single resistor is known from "Influence of Transmission-Line Interconnections Between Gigabit-per-Second IC's on Time Jitter and Instabilities" by J. Hauenschild and H. M. Rein, IEEE Journal of Solid-State Circuits, Vol. 25, No. 3, June 1990, pp. 763–766. The resistor is inserted between the collector and the base of a transistor which forms part of a buffer stage located at the input of the electronic circuit. The drawback of this circuit is that the DC voltage at the point where the transmission line is connected to the electronic circuit, also termed the transmission line termination, cannot be set at will but depends on the D.C. voltage on a reference potential, usually the positive supply voltage, to which the resistor is connected. This means that the DC voltage at other locations in the circuit cannot be set at will either, but depends on the DC voltage on the reference potential. In the circuit according to the invention the DC voltage at the transmission line termination can be set indeed by a selection of the settings of the active impedance. This results in greater flexibility for setting the DC voltage at points in the remaining part of the circuit.

Furthermore, the terminating impedance in the known circuit, if an on-chip resistor is used, is not very accurate, which may result in enhanced reflection coefficients. In the circuit according to the invention the terminating impedance may be accurately readjusted, as required, by readjusting the active impedance. This is possible by modifying the setting of these impedances.

Finally, the known circuit operates less well for high frequencies than the circuit according to the invention. Since the DC voltage between the collector and the base of the buffer transistor is small, the transistor junction capacitance present between the collector and base has a relatively large value, so that this makes the value of the terminating impedance decrease at high frequencies.

These and other aspects of the invention will be apparent from and elucidated with reference to the embodiments described hereinafter.

DETAILED DESCRIPTION OF THE PREFERRED EMBODIMENTS

Figure 1:
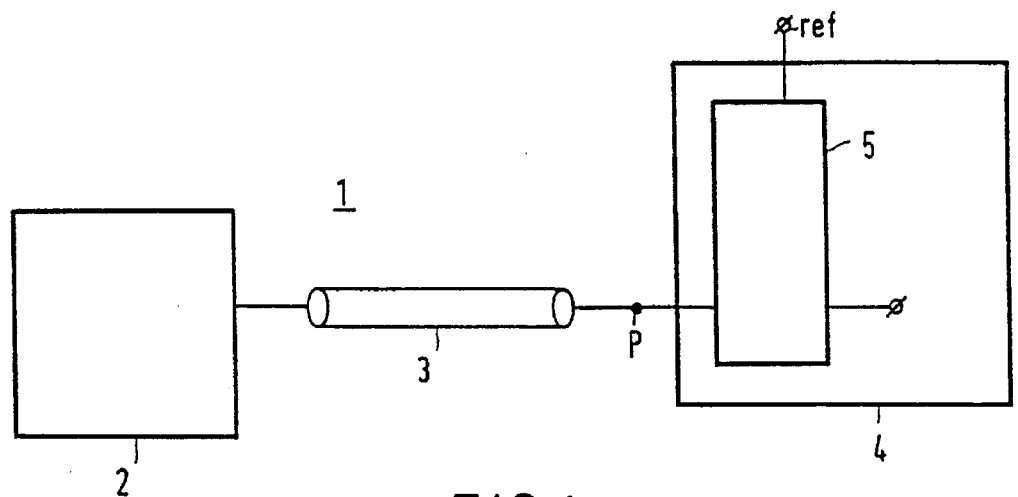
FIG. 1 shows a printed circuit board comprising two integrated electronic circuits connected by a transmission line.

FIG. 1 shows a printed circuit board 1 comprising two integrated electronic circuits 2, 4 connected by a transmission line 3. The transmission line is formed by a microstrip line. To avoid signal reflections, a terminating impedance 5 is inserted at the end of the transmission line between a transmission line termination p and a reference potential ref.

The terminating impedance is to match substantially with the characteristic impedance of the transmission line in a frequency range of the circuit.

Figure 2A:
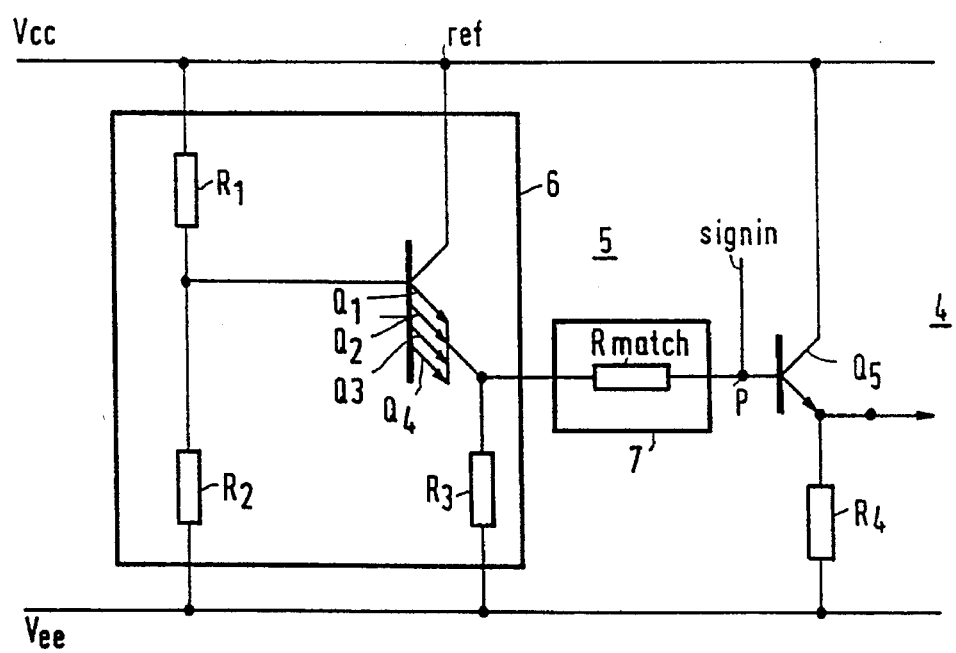
FIG. 2a shows an electronic circuit according to the invention.

FIG. 2a shows an electronic circuit according to the invention. The supply voltages are denoted Vcc and Vee, respectively. The signal coming in over the transmission line is referenced signin. This signal is applied to the further part of the circuit (not shown) via a buffer transistor Q5 which is set by means of a resistor R4. This further part may consist of logic gates, amplifier stages and so on. Between the transmission line termination and the reference potential there is a series combination of an active impedance 6 and a passive impedance 7 to control the signal behavior. The passive impedance 7 is preferably formed by a single resistor Rmatch as is shown in the drawing Figure. The active impedance is formed by the output impedance of a common collector stage. The common collector stage consists of setting resistors R1, R2 and R3 and parallel transistors Q1, Q2, Q3, Q4. The terminating impedance is formed by the sum of the resistance Rmatch and the output impedance of the common collector stage. The output impedance of the common collector stage has a small value as is widely known. For low frequencies this output impedance may be approached by the inverted value of the sum of the transconductance gm of the employed transistors Q1, Q2, Q3, Q4.

Figure 3A:
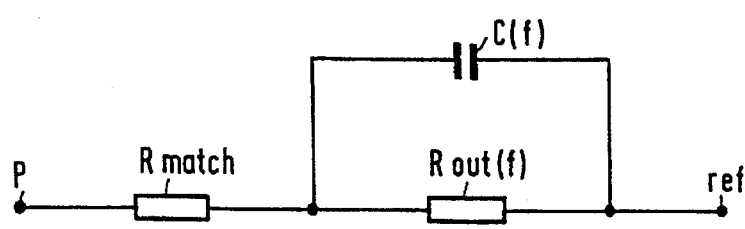
FIG. 3a shows what elements mainly determine the terminating impedance.
Figure 3B:
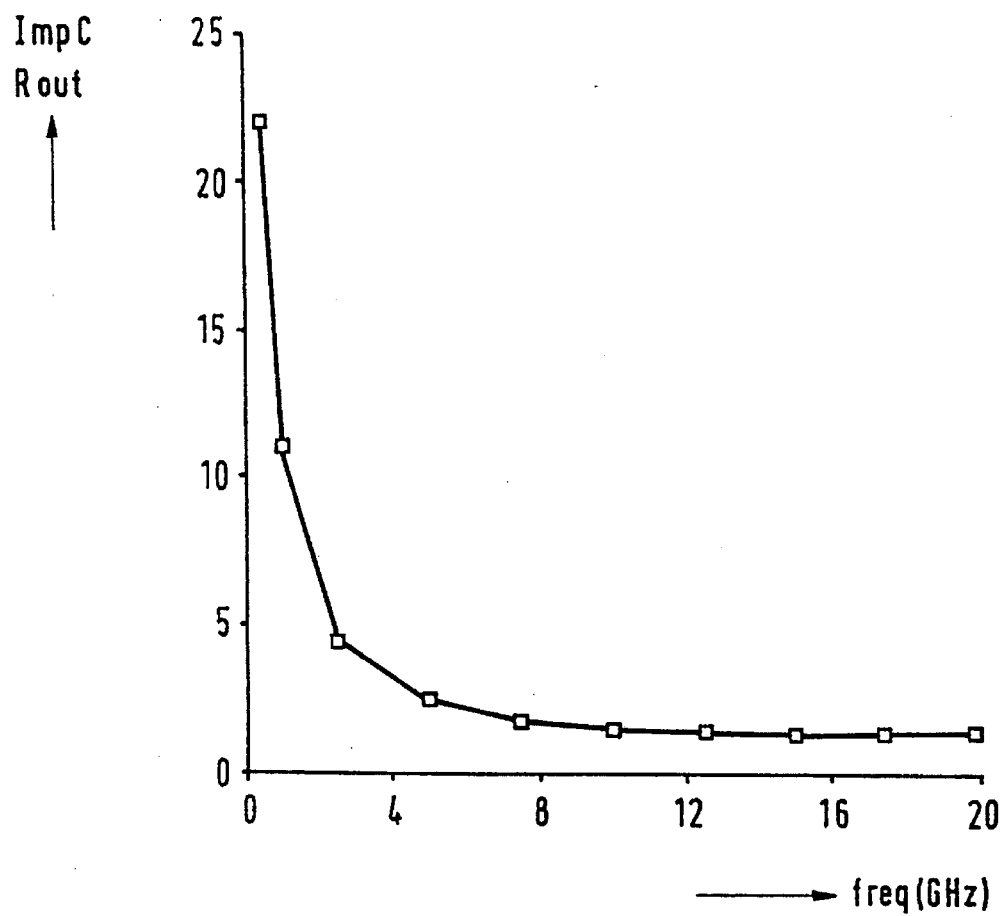
FIG. 3b shows the impedance ratio of the resistive part and capacitive part of the active impedance plotted against frequency.

A frequently used characteristic impedance of transmission lines is 50 Ohms. This implies that the terminating impedance is to be 50 Ohms too to have a proper termination of such a transmission line. Since the output impedance of the common collector stage decreases at high frequencies, it is necessary to select the resistance Rmatch of the same order of magnitude as the characteristic impedance of the transmission line. The greater part of the terminating impedance is then formed by the resistance Rmatch. The remaining part is formed by the output impedance of the common collector stage. FIG. 3a shows what elements mainly determine the terminating impedance. There is a frequency-dependent capacitor part C(f) combined in parallel with the frequency-dependent resistive part Rout(f) of the output impedance of the common collector stage. This capacitive part is caused by the junction capacitances and diffusion capacitances of the transistors Q1, Q2, Q3, Q4. The value this capacitive part exactly has depends on the employed types of transistors and the configuration used. At low frequencies the terminating impedance is equal to the sum of the value of the resistance Rmatch and the resistive part of the output impedance Rout. The capacitive part causes the terminating impedance to drop at high frequencies. FIG. 3b shows the impedance ratio of the resistive part and the capacitive part of the active impedance plotted against frequency. It is observed that the impedance ratio drops to about 1 at high frequencies.

The resistive part of the active impedance Rout is approximately equal at low frequencies to the inverted value of the sum of the transconductances of the transistors Q1, Q2, Q3, Q4 and can thus be matched by varying the collector current flowing through these transistors. This property may be employed for readjusting the terminating impedance. This may be necessary, because the value of the resistance Rmatch, if manufactured on-chip, is not exactly defined.

The DC voltage at the transmission line termination and thus also the DC voltage at other locations in the circuit may be set as desired. They depend on the ratio of setting resistance R1 to R2.

Figure 2B:
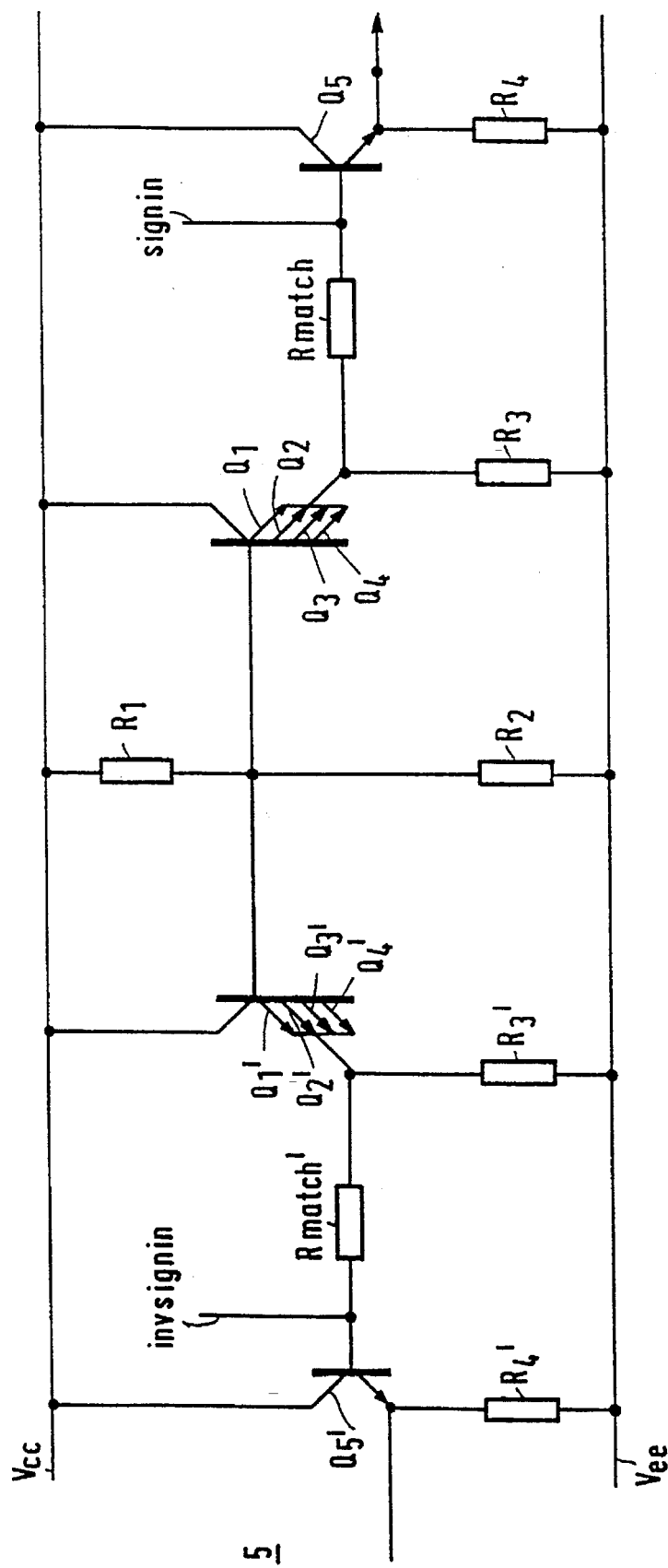
FIG. 2b shows the electronic circuit according to the invention with balanced operation.

The circuit according to the invention can also be used in a balanced version for even better performance. This is shown in FIG. 2b. The components R3', R4', Rmatch', Q1', Q2', Q3', Q4', Q5' shown in the left portion have the same value as the corresponding components shown in the right portion R3, R4, Rmatch, Q1, Q2, Q3, Q4, Q5. The signal invsignin applied to the left portion of the circuit shows a 180° phase difference with the signal signin applied to the right portion.

Figure 4:
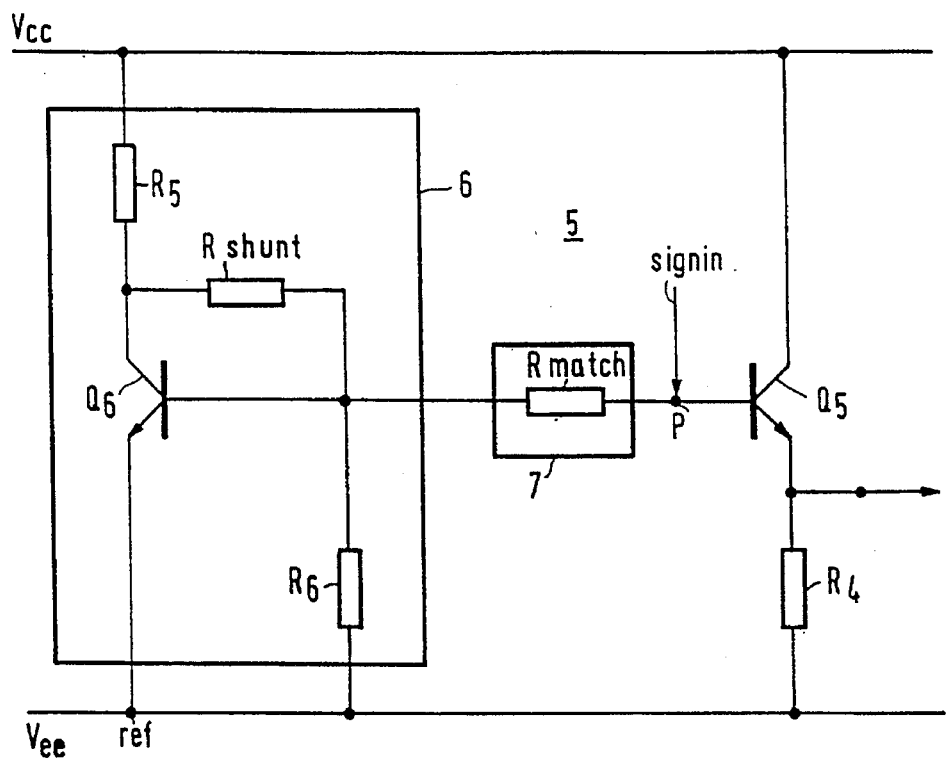
FIG. 4 shows a second embodiment for the circuit according to the invention.

FIG. 4 shows a second embodiment of the circuit according to the invention. In this embodiment the active impedance 6 is the active impedance, of a shunt stage. The shunt stage is formed by transistor Q6 and resistors R5, R6 and Rshunt. When the resistances R5 and R6 and Rshunt are properly selected, the input impedance of the shunt stage is low, as is widely known. By selecting the resistance Rmatch of the same order of magnitude as the characteristic impedance of the transmission line, there is achieved that the terminating impedance is mainly formed by this resistance Rmatch. This results in the fact that, in analogy with the circuit shown in FIG. 2a, also the circuit shown in this Figure has a terminating impedance which remains reasonably constant at high frequencies.

Figure 5:
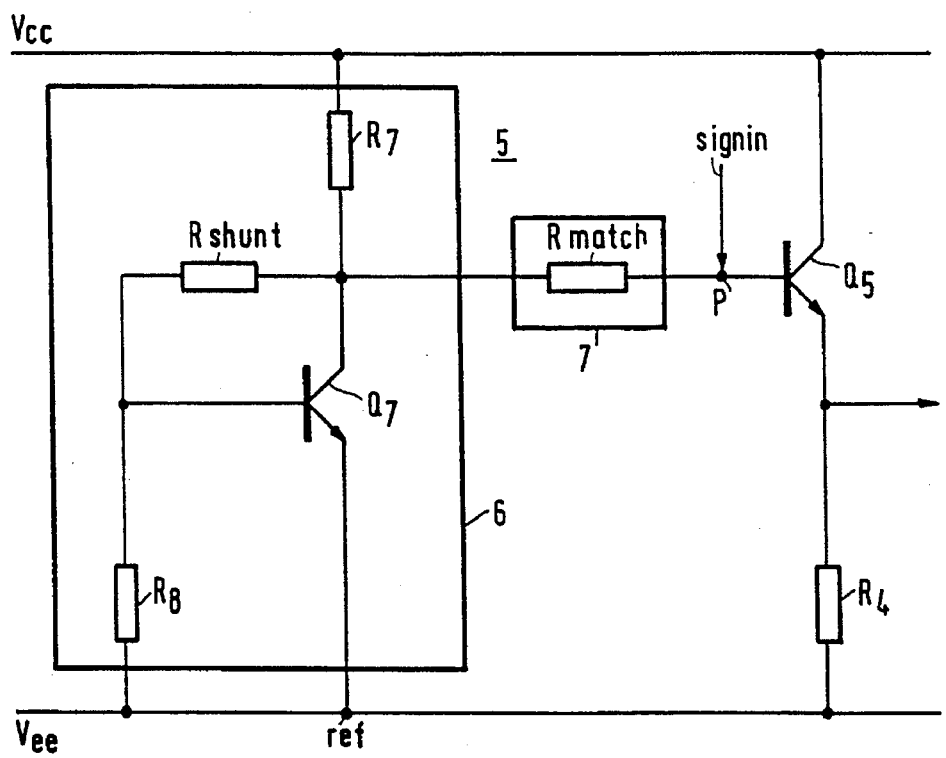
FIG. 5 shows a third embodiment for the circuit according to the invention and FIG. 6a shows a simulation of the signal reflection coefficient of the circuit, shown in FIG. 2a and of the circuit shown in cited Japanese Patent Application, plotted against frequency.

FIG. 5 shows a third embodiment for the circuit according to the invention. In this embodiment the active impedance 6 is the input impedance of a shunt stage. The shunt stage is formed by transistor Q7 and resistors R7, R8 and Rshunt. If the setting impedances R7, R8 and Rshunt are properly selected, the output impedance of the shunt stage will be low. By selecting the resistance Rmatch of the same order of magnitude as the characteristic impedance of the transmission line, there is achieved that the terminating impedance is mainly formed by this resistor Rmatch.

Different configurations from those shown in FIGS. 2a, 4 and 5 are possible. In general there may be observed that the configurations in which a small active impedance is combined in series with a passive impedance which lies in the neighbourhood of the characteristic impedance, lead to a favourable behaviour at high frequencies.

Figure 6A:
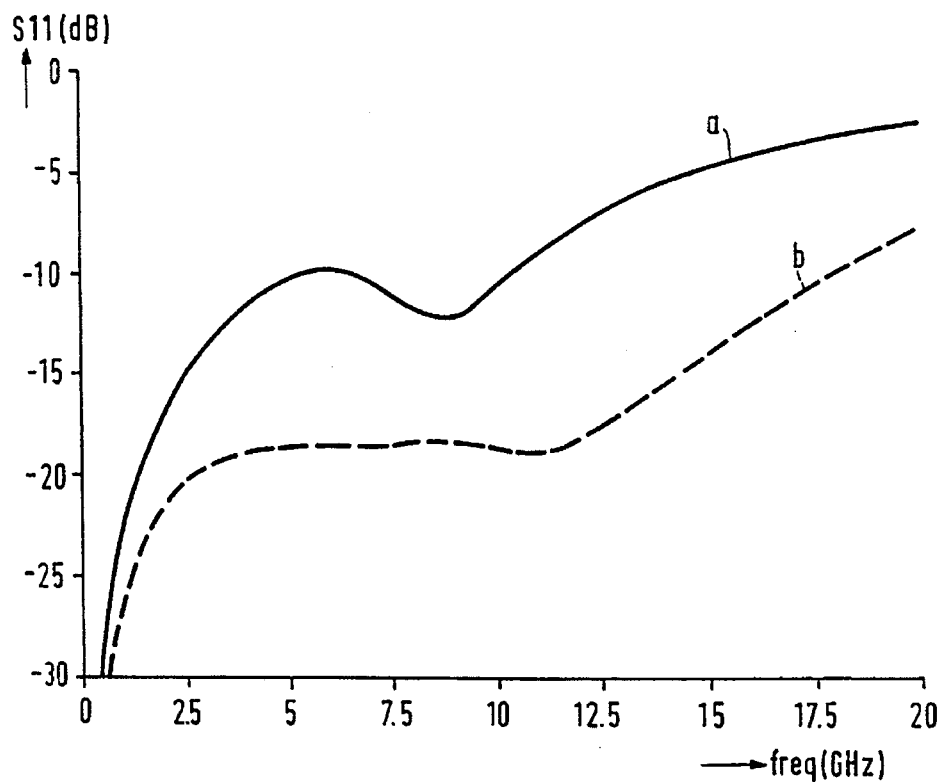

FIG. 6a shows simulations of the signal reflection coefficient S11 of the circuit shown in FIG. 2a and the circuit as used in Japanese Patent Application 60-102011 plotted against frequency. The dashed curve denotes the curve of the circuit shown in FIG. 2a, the solid line denotes the curve of the circuit from the Japanese Patent Application. A transmission line having a characteristic impedance of 50 Ohms is assumed. The low-frequency terminating impedance in both circuits is set to 50 Ohms. It is noticeable that the signal reflection in the circuit according to the invention remains below −15 dB up to about 14 GHz, whereas the reflection in the circuit shown in Japanese Patent Application 60-102011 already starts exceeding this value at approximately 2.5 GHz.

Figure 6B:
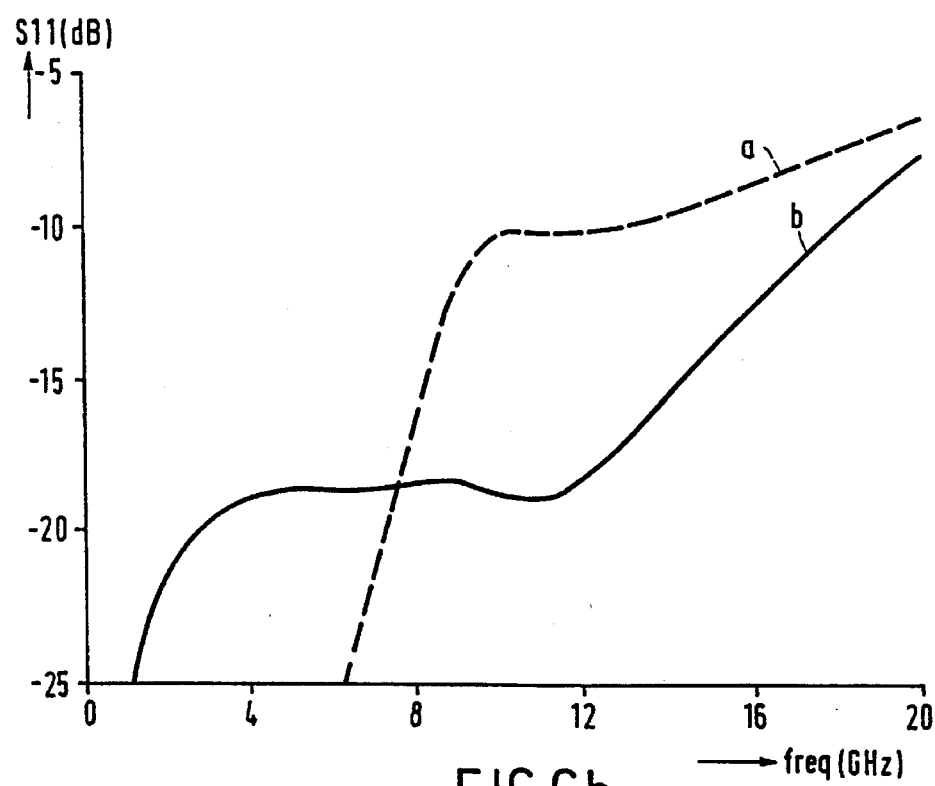
FIG. 6b shows a simulation of the signal reflection coefficient of the circuit shown in FIG. 2a and of the circuit according to "Influence of Transmission-Line Interconnections Between Gigabit-per-Second IC's on Time Jitter and Instabilities" by J. Hauenschild and H. M. Rein, IEEE Journal of Solid-State Circuits, Vol. 25, No. 3, June 1990, pp. 763–766.

FIG. 6b shows simulations of the signal reflection coefficient S11 of the circuit shown in FIG. 2a and the circuit as used in "Influence of Transmission-Line Interconnections Between Gigabit-per-Second IC's on Time Jitter and Instabilities" by J. Hauenschild and H. M. Rein, IEEE Journal of Solid-State Circuits, Vol. 25, No. 3, June 1990, pp. 763–766, plotted against frequency. The solid curve denotes the curve of the circuit shown in FIG. 2a, the dashed curve denotes the curve of the circuit according to Hauenschild and Rein. A transmission line having a characteristic impedance of 50 Ohms is assumed. The low-frequency terminating impedance is set to 50 Ohms in the two circuits. There can be observed that the signal reflection in the circuit according to the invention continues to be −15 dB up to about 14 GHz, whereas the reflection in the circuit according to Hauenschild and Rein exceeds this value for the first time already at about 8 GHz.

What is claimed is:

1. Electronic circuit having an input and an output, the input coupled to the termination of a transmission line, the transmission line having a characteristic impedance, the electronic circuit comprising a terminating impedance and a buffer stage, the terminating impedance and the buffer stage being separately connected to the termination of the transmission line at the input, the buffer stage coupling the transmission line to the output, the terminating impedance matching the characteristic impedance of the transmission line for a selected frequency range and including a series combination of an active impedance and a passive impedance, the passive impedance being of the same order of magnitude as the characteristic impedance.

2. The electronic circuit of claim 1, wherein said terminating impedance is inserted between the transmission line and a reference potential.

3. The electronic circuit of claim 1, wherein said passive impedance comprises a resistor.

4. The electronic circuit of claim 3, wherein said active impedance comprises the output impedance of a common collector stage.

5. The electronic circuit of claim 4, wherein said common collector stage comprises a plurality of parallel transistors, and the terminating impedance is formed by the sum of the resistance of the resistor and the output impedance of the common collector stage.

6. The electronic circuit of claim 1, wherein said active impedance comprises the output impedance of a common collector stage.

7. The electronic circuit of claim 1, wherein said active impedance is provided by a frequency-dependent capacitive device combined in parallel with a frequency-dependent resistive device.

8. The electronic circuit of claim 7, wherein said passive impedance comprises a resistor.

9. The electronic circuit of claim 1, wherein said active impedance comprises the output impedances of a pair of balanced common collector stages.

10. The electronic circuit of claim 1, wherein said active impedance comprises the active impedance of a shunt stage, the shunt stage including a transistor and one or more resistors, including a shunt resistor.

11. The electronic circuit of claim 1, wherein said active impedance comprises the input impedance of a shunt stage, the shunt stage including a transistor and one or more resistors, including a shunt resistor.

12. The electronic circuit of claim 1, wherein said active impedance is provided so as to be small relative to the passive impedance.

* * * * *